(12) United States Patent
Hashimoto

(10) Patent No.: US 10,381,152 B2
(45) Date of Patent: Aug. 13, 2019

(54) COIL COMPONENT AND COIL-COMPONENT-EQUIPPED MOUNTING SUBSTRATE

(71) Applicant: Murata Manufacturing Co., Ltd., Kyoto-fu (JP)

(72) Inventor: Ryota Hashimoto, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/110,915

(22) Filed: Aug. 23, 2018

(65) Prior Publication Data

US 2019/0066911 A1  Feb. 28, 2019

(30) Foreign Application Priority Data

Aug. 29, 2017  (JP) ................. 2017-164099

(51) Int. Cl.
| | |
|---|---|
| H01F 27/29 | (2006.01) |
| H01F 27/28 | (2006.01) |
| H01F 27/24 | (2006.01) |
| H05K 1/18 | (2006.01) |
| H05K 1/02 | (2006.01) |
| H01F 17/04 | (2006.01) |
| H05K 3/34 | (2006.01) |

(52) U.S. Cl.
CPC .......... *H01F 27/292* (2013.01); *H01F 17/04* (2013.01); *H01F 27/24* (2013.01); *H01F 27/2823* (2013.01); *H05K 1/0271* (2013.01); *H05K 1/181* (2013.01); *H05K 3/3405* (2013.01); *H05K 2201/1003* (2013.01); *H05K 2201/10636* (2013.01)

(58) Field of Classification Search
CPC .... H01F 27/292; H01F 27/24; H01F 27/2823; H05K 1/181; H05K 2201/1003
USPC ....................................... 174/260
See application file for complete search history.

(56) References Cited

U.S. PATENT DOCUMENTS

| | | | | |
|---|---|---|---|---|
| 6,157,283 A * | 12/2000 | Tsunemi | ............... | H01F 27/292 336/192 |
| 2006/0071749 A1* | 4/2006 | Aoki | ..................... | H01F 17/045 336/83 |
| 2009/0295525 A1* | 12/2009 | Okawa | ................... | H01F 27/006 336/192 |
| 2015/0084481 A1* | 3/2015 | Mori | ....................... | H01C 1/148 310/311 |
| 2015/0325373 A1* | 11/2015 | Satou | ..................... | H01G 4/232 361/301.4 |
| 2016/0042868 A1* | 2/2016 | Otsuka | ..................... | H01G 4/30 361/301.4 |

(Continued)

FOREIGN PATENT DOCUMENTS

JP  2011-077183 A  4/2011

*Primary Examiner* — Sherman Ng

(74) *Attorney, Agent, or Firm* — Studebaker & Brackett PC

(57) ABSTRACT

A coil component has an outer electrode include a bottom-surface electrode portion disposed along a bottom surface of a component body and an end-surface electrode portion disposed along an end surface of the component body so as to be continuous with the bottom-surface electrode portion. The adhesive strength of the bottom-surface electrode portion with respect to the component body is lower than that of the end-surface electrode portion with respect to the component body.

20 Claims, 4 Drawing Sheets

(56) References Cited

U.S. PATENT DOCUMENTS

2016/0276104 A1* 9/2016 Nishisaka ............ H01G 4/2325
2017/0125157 A1* 5/2017 Hess ..................... H01F 41/076

* cited by examiner

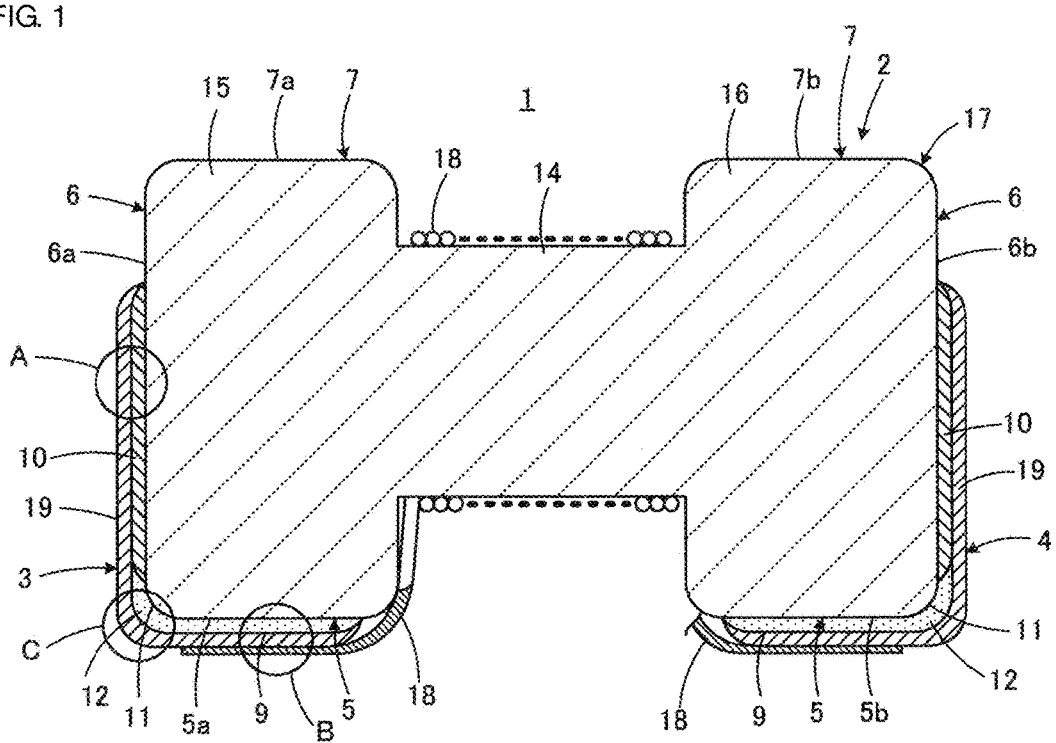

COIL COMPONENT AND COIL-COMPONENT-EQUIPPED MOUNTING SUBSTRATE

CROSS-REFERENCE TO RELATED APPLICATION

This application claims benefit of priority to Japanese Patent Application No. 2017-164099, filed Aug. 29, 2017, the entire content of which is incorporated herein by reference.

BACKGROUND

Technical Field

The present disclosure relates to a coil component and a coil-component-equipped mounting substrate, and more particularly to a coil component that includes a component body and an outer electrode formed on an outer surface of the component body and a coil-component-equipped mounting substrate that includes such a coil component.

Background Art

An example of a coil component related to the present disclosure is a coil component described in Japanese Unexamined Patent Application Publication No. 2011-77183. The coil component described in Japanese Unexamined Patent Application Publication No. 2011-77183 includes a drum core that includes a winding core portion and first and second flange portions, which are provided at the ends of the winding core portion. Wires are wound around the winding core portion of the drum core. Outer electrodes are formed on the first and second flange portions of the drum core, and ends of the wires are electrically connected to the outer electrodes.

The above-mentioned outer electrodes are formed by applying and baking an electrically conductive paste containing silver as an electrically conductive component and then performing nickel plating and tin plating. In addition, each of the outer electrodes is formed so as to extend from a bottom surface of a corresponding one of the flange portions, the bottom surface facing a mounting surface, to a top surface of the flange portion that faces in a direction opposite to the direction in which the bottom surface faces through an end surface of the flange portion, the end surface being located on the side opposite to the side on which the winding core portion is present.

SUMMARY

The coil component described in Japanese Unexamined Patent Application Publication No. 2011-77183 is usually put to practical use by being mounted onto a mounting substrate. A mounting structure of the coil component is realized by soldering the outer electrodes of the coil component to conductors included in the mounting substrate.

In the above-mentioned mounted state, stress generated as a result of temperature changes is most likely to concentrate at solder portions that connect the outer electrodes of the coil component to the conductors of the mounting substrate, and as a result, cracks are likely to be generated in the solder portions. In addition, in the mounted state, stress is also generated when deflection occurs in the mounting substrate, and the stress may sometimes cause fracturing of the drum core.

Accordingly, the present disclosure provides a coil component capable of reducing the probability of generation of a crack in a solder portion and a fracture in a component body such as a drum core, which have been described above. The present disclosure also provides a coil-component-equipped mounting substrate that includes the above-described coil component. Accordingly, the present disclosure has been made on the basis of a viewpoint that problems such as those described above occur in the technology described in Japanese Unexamined Patent Application Publication No. 2011-77183 because the outer electrodes are strongly fixed to the component body.

A coil component according to one embodiment of the present disclosure includes a component body and an outer electrode that is formed on an outer surface of the component body. The component body at least has a bottom surface facing a mounting surface and an end surface extending in a direction away from the mounting surface. The outer electrode includes a bottom-surface electrode portion that is disposed along the bottom surface of the component body and an end-surface electrode portion that is disposed along the end surface of the component body so as to be continuous with the bottom-surface electrode portion. An adhesive strength of the bottom-surface electrode portion with respect to the component body is lower than an adhesive strength of the end-surface electrode portion with respect to the component body. This configuration realizes a state where the bottom-surface electrode portion is capable of easily moving with respect to the component body when an external force acts on the outer electrode.

In the coil component, the adhesive strength of the bottom-surface electrode portion with respect to the component body may be about zero, as in a case where the bottom-surface electrode portion is separated from the component body. In the coil component, the component body preferably includes a round chamfered portion that is formed at a ridge line portion between the bottom surface and the end surface, and the bottom-surface electrode portion further includes a round electrode portion that is disposed along the round chamfered portion and that extends to the end-surface electrode portion. With this configuration, the round electrode portion can be included in the portion of the bottom-surface electrode portion that is capable of easily moving with respect to the component body.

Preferably, the component body included in the coil component according to the preferred embodiment of the present disclosure includes a core including a winding core portion, a first flange portion, which is formed at a first end of the winding core portion, and a second flange portion, which is formed at a second end of the winding core portion that is opposite to the first end of the winding core portion, and a wire that is wound around the winding core portion. In this case, the above-mentioned bottom surface includes flange-portion bottom surfaces of the first and second flange portions that face the mounting surface, and the above-mentioned end surface include flange-portion end surfaces of the first and second flange portions that are located on a side opposite to a side on which the winding core portion is present. In addition, the outer electrode is electrically connected to an end of the wire and is formed so as to extend from the flange-portion bottom surface to the flange-portion end surface of one of the first and second flange portions. This configuration is employed in a common wire-wound coil component.

In the case that each of the first and second flange portions has a flange-portion top surface facing in a direction opposite to the direction in which the corresponding flange-portion bottom surface faces, it is preferable that the end-surface electrode portion of the outer electrode is not formed on the flange-portion top surface and a portion of the flange-portion end surface adjacent to the flange-portion top surface. With this configuration, magnetic flux generated in the coil component can be prevented from being blocked by the outer electrode.

In addition, it is preferable that the flange-portion bottom surface has a low resistance portion having an electrical resistance lower than an electrical resistance of another portion of the core and that the bottom-surface electrode portion is an electroplated film precipitated on the low resistance portion. The electroplated film precipitated on the low resistance portion as mentioned above can have a relatively low adhesive strength with respect to the core. Also, instead of forming the bottom-surface electrode portion in a manner described in the above embodiment, even if the bottom-surface electrode portion is made of a resin that contains metal powder and that does not contain glass, the adhesive strength of the bottom-surface electrode portions with respect to the core can be relatively low.

In the coil component, the end-surface electrode portion is preferably a sputtered film. The end-surface electrode portion of a sputtered film can obtain a relatively high adhesive strength with respect to the core. Also, instead of forming the end-surface electrode portion in a manner described in the above embodiment, even if the end-surface electrode portion is a conductor containing a glass coupled to the core, the end-surface electrode portion can obtain a relatively high adhesive strength with respect to the core.

In the coil component, it is preferable that the outer electrode further includes an outer-layer plated film that coats the bottom-surface electrode portion and the end-surface electrode portion in a continuous manner. With this configuration, even if the bottom-surface electrode portion having a relatively low adhesive strength separate from the bottom surface of the component body, the bottom-surface electrode portion can be maintained in a state of being held by the end-surface electrode portion having a relatively high adhesive strength via the outer-layer plated film.

In the above case, it is further preferable that the outer-layer plated film has a thickness of about 10 μm or more. With this configuration, the outer-layer plated film can obtain a mechanical strength equal to or higher than a predetermined degree. As a result, the outer-layer plated film can more reliably exhibit its function of causing the bottom-surface electrode portion separated from the component body to be held by the end-surface electrode portion via the outer-layer plated film.

In the coil component, the adhesive strength of the bottom-surface electrode portion, which is lower than the adhesive strength of the end-surface electrode portion, may be about zero as mentioned above. In other words, the bottom-surface electrode portion may be in a state of being separated from the bottom surface of the component body. This state may occur after the coil component has been mounted on a mounting substrate. Therefore, the present disclosure is also directed to a mounting structure of a coil component such as that described below.

A coil-component-equipped mounting substrate according to another embodiment of the present disclosure includes the coil component according to the above-described preferred embodiment of the present disclosure and a mounting substrate onto which the coil component is mounted and that includes a conductor to which the outer electrode are soldered. At least a portion of the bottom-surface electrode portion has separated from the bottom surface of the component body.

In the coil component according to the present disclosure, the adhesive strength of the bottom-surface electrode portion of the outer electrode with respect to the component body is set to be lower than the adhesive strength of the end-surface electrode portion of the outer electrode with respect to the component body, and thus, when an external force acts on the outer electrode, first, the bottom-surface electrode portion can move with respect to the component body. Therefore, in a mounted state of the coil component, stress that causes cracks to be generated in solder portions and a fracture to occur in the component body can be favorably released, and a mounting structure that is highly resistant to temperature changes and to deflection that occurs in a mounting substrate can be realized.

Other features, elements, characteristics and advantages of the present disclosure will become more apparent from the following detailed description with reference to the attached drawings.

BRIEF DESCRIPTION OF THE DRAWINGS

FIG. 1 is a sectional view illustrating a coil component according to an embodiment of the present disclosure when viewed from the front;

DETAILED DESCRIPTION

Figure 2A:
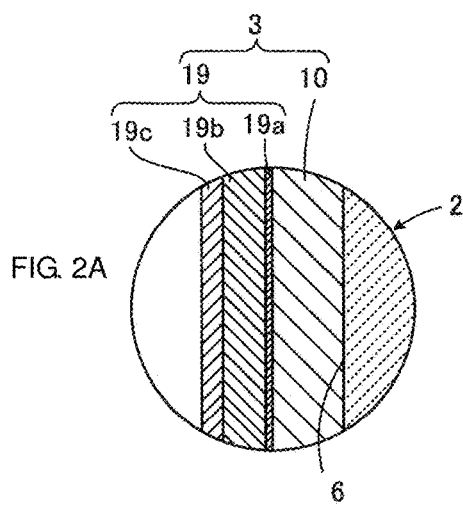
FIG. 2A is an enlarged sectional view of a portion of the coil component illustrated in FIG. 1.

A coil component 1 according to an embodiment of the present disclosure will be described with reference to FIGS. 1 to 3. The coil component 1 illustrated in FIGS. 1 to 3 is a wire-wound coil component.

The coil component 1 includes a component body 2 and first and second outer electrodes 3 and 4 that are formed on an outer surface of the component body 2. The component body 2 at least has a bottom surface 5 facing a mounting surface, end surfaces 6 each extending in a direction away from the mounting surface, and a top surface 7 facing in a direction opposite to the direction in which the bottom surface 5 faces. Each of the outer electrodes 3 and 4 at least includes a bottom-surface electrode portion 9 that is disposed along the bottom surface 5 of the component body 2 and an end-surface electrode portion 10 that is disposed along one of the end surfaces 6 of the component body 2 so as to be continuous with the bottom-surface electrode portion 9.

A feature of the present disclosure is that the adhesive strength of each of the bottom-surface electrode portions 9 with respect to the component body 2 is set to be lower than the adhesive strength of each of the end-surface electrode portions 10 with respect to the component body 2. This configuration realizes a state where the bottom-surface electrode portions 9, which are portions of the outer electrodes 3 and 4, are capable of moving with respect to the component body 2 by, for example, separating from the component body 2 as illustrated in FIG. 3 when an external force acts on the outer electrodes 3 and 4.

In the present embodiment, the component body 2 includes round chamfered portions 11 formed at ridge line portions between the bottom surface 5 and the end surfaces 6, and each of the above-mentioned bottom-surface electrode portions 9 includes a round electrode portion 12 that is disposed along a corresponding one of the round chamfered portions 11 and that extends to a corresponding one of the end-surface electrode portions 10. With this configuration, the round electrode portions 12 can be included in the portions of the bottom-surface electrode portions 9 that are capable of moving with respect to the component body 2. Therefore, the outer electrodes 3 and 4 can be more resistant to thermal fatigue at the time of soldering and to deflection.

As mentioned above, the coil component 1 illustrated in FIGS. 1 to 3 is a wire-wound coil component. Accordingly, the component body 2 includes a core 17 including a winding core portion 14, a first flange portion 15 that is formed at a first end of the winding core portion 14, and a second flange portion 16 that is formed at a second end of the winding core portion 14 that is opposite to the first end of the winding core portion 14, and a wire 18 that is wound around the winding core portion 14. The core 17 is made of an electrical insulating property, and more specifically is made of a magnetic material such as ferrite, a non-magnetic material such as alumina, a curing resin, or the like. Note that, in FIG. 1 and FIG. 3, the wire 18 is illustrated in a simplified manner. The wire 18 may be wound around the winding core portion 14 in a single-layer winding or may be wound around the winding core portion 14 in a double-layer winding.

In this case, the above-mentioned bottom surface 5 includes a flange-portion bottom surface 5a of the first flange portion 15 and a flange-portion bottom surface 5b of the second flange portion 16, the flange-portion bottom surfaces 5a and 5b facing the mounting surface. The above-mentioned end surfaces 6 include a flange-portion end surface 6a of the first flange portion 15 and a flange-portion end surface 6b of the second flange portion 16, the flange-portion end surfaces 6a and 6b being located on the side opposite to the side on which the winding core portion 14 is present. The above-mentioned top surface 7 includes a flange-portion top surface 7a of the first flange portion 15 and a flange-portion top surface 7b of the second flange portion 16.

The first outer electrode 3 is formed so as to extend at least from the flange-portion bottom surface 5a to the flange-portion end surface 6a of the first flange portion 15, and the second outer electrode 4 is formed so as to extend at least from the flange-portion bottom surface 5b to the flange-portion end surface 6b of the second flange portion 16. More specifically, the end-surface electrode portion 10 of the outer electrode 3 is not formed on a portion of the flange-portion end surface 6a of the first flange portion 15, the portion being adjacent to the flange-portion top surface 7a, and the end-surface electrode portion 10 of the outer electrode 4 is not formed on a portion of the flange-portion end surface 6b of the second flange portion 16, the portion being adjacent to the flange-portion top surface 7b. Accordingly, the outer electrode 3 is not formed on the flange-portion top surface 7a of the first flange portion 15, and the outer electrode 4 is not formed on the flange-portion top surface 7b of the second flange portion 16. With this configuration, the magnetic flux generated in the coil component 1 can be prevented from being blocked by the outer electrodes 3 and 4.

The ends of the wire 18 are respectively connected to the first and second outer electrodes 3 and 4 by, for example, thermocompression bonding. In the present embodiment, as illustrated in FIG. 1, the ends of the wire 18 are respectively connected to the first and second outer electrodes 3 and 4 on the side on which the bottom surface 5 of the component body 2 is present. However, if it is desired to further stabilize the connection between the wire 18 and the outer electrodes 3 and 4, although not illustrated, the ends of the wire 18 may be respectively connected to the first and second outer electrodes 3 and 4 on the side on which the end surfaces 6 of the component body 2 are present or on the side on which the top surface 7 of the component body 2 is present.

There are several embodiments to realize a characteristic configuration according to the present disclosure in which, as described above, the adhesive strength of each of the bottom-surface electrode portions 9 with respect to the component body 2 is lower than the adhesive strength of each of the end-surface electrode portions 10 with respect to the component body 2. These embodiments include several embodiments related to the bottom-surface electrode portions 9 and several embodiments related to the end-surface electrode portions 10. Usually, the embodiments related to the bottom-surface electrode portions 9 and the embodiments related to the end-surface electrode portions 10 can be suitably combined with one another.

The embodiments related to the bottom-surface electrode portions 9 include a first embodiment in which electroplated film that are formed by, for example, a laser plating method are used as the bottom-surface electrode portions 9. More specifically, in this first embodiment, in the case where the core 17 is made of a ceramic, such as ferrite or alumina, the bottom-surface electrode portions 9 are formed by radiating a laser beam onto portions of a surface of the core 17 at which the bottom-surface electrode portions 9 are to be positioned so as to cause each of the portions to have electrical conductivity, that is, so as to reduce the resistance of each of the portions, and then performing electroplating on these low resistance portions. Each of the bottom-surface electrode portions 9 is formed of a plated film made of a conductive metal, such as silver or copper. The electroplated film formed by the above method are influenced by modification of the surface of the core 17 using the laser beam, and thus, each of the bottom-surface electrode portions 9 has a relatively low adhesive strength with respect to the component body 2.

When making the portions of the core 17 become the low resistance portions each having an electrical resistance lower than that of the other portions of the core 17 in order to form the bottom-surface electrode portions 9, a method other than laser beam radiation may be employed. In other words, in the portions of the core 17 to which the laser beam has been radiated, a metal oxide is reduced and becomes a metal which is not oxidized, and the low resistance portions each having electrical conductivity are formed. Therefore, a reduction method other than laser beam radiation may be applied.

Note that the low resistance portions are formed by laser beam radiation so as to have a predetermined depth from the surface of the core 17, and there is a possibility that the surface of the low resistance portions of the core 17 will be oxidized again by being exposed to an atmosphere. Thus, there is a possibility that the resistances of portions of the surfaces of the low resistance portions will be increased. However, even in this case, the above-mentioned electroplating will not usually become completely impossible. On the contrary, in this case, it is assumed that the adhesive strength of each of the electroplated film is further decreased, which in turn leads to results that are preferable for the bottom-surface electrode portions 9.

The embodiments related to the bottom-surface electrode portions 9 include a second embodiment in which the bottom-surface electrode portions 9 are made of a resin that contains metal powder and that does not contain glass. Since the bottom-surface electrode portions 9 according to this second embodiment do not contain glass that functions as an adhesive with respect to the core 17, the bottom-surface electrode portions 9 each have a relatively low adhesive strength with respect to the component body 2. As the metal powder included in the bottom-surface electrode portions 9, for example, powder of a conductive metal, such as silver or copper, can be used. As the resin included in the bottom-surface electrode portions 9, a curing resin, such as a thermosetting resin or an ultraviolet-ray-curing resin may be used, or a thermoplastic resin may be used.

The embodiments related to the end-surface electrode portions 10 include a first embodiment in which the end-surface electrode portions 10 are formed of sputtered films. Each of the end-surface electrode portions 10, which are formed of sputtered films, can obtain a relatively high adhesive strength with respect to the core 17. The sputtered films are formed by, for example, sputtering using a conductive metal, such as silver or copper, as a target.

The embodiments related to the end-surface electrode portions 10 include a second embodiment in which the end-surface electrode portions 10 are conductors containing glass coupled to the core 17. In this case, the glass functions as an adhesive with respect to the core 17, and each of the end-surface electrode portions 10 can have a relatively high adhesive strength with respect to the core 17. The above-mentioned conductors forming the end-surface electrode portions 10 each contain, for example, silver or copper as an electrically conductive component.

Note that the above-described laser plating method, which is used for forming the above-mentioned bottom-surface electrode portions 9 or the above-mentioned end-surface electrode portions 10, the glass-free resin electrodes, the glass electrodes, and the sputtered electrodes are not limited to being used in the above exemplary combination and may be freely combined with one another. Any combination can be employed as long as the adhesive strength of each of the bottom-surface electrode portions 9 with respect to the component body 2 is lower than the adhesive strength of each of the end-surface electrode portions 10 with respect to the component body 2.

Although the order in which the process of forming the bottom-surface electrode portions 9 and the process of forming the end-surface electrode portions 10 are performed is not particularly limited, it is preferable that one of the processes that requires a higher temperature be performed before the other of the processes that can be performed at a lower temperature is performed in order to make the electrode portions formed through the process that is performed first less likely to be influenced by the subsequent process.

In the present embodiment, each of the first and second outer electrodes 3 and 4 further includes an outer-layer plated film 19 that coats a corresponding one of the bottom-surface electrode portions 9 and a corresponding one of the end-surface electrode portions 10 in a continuous manner. With this configuration, for example, even when the bottom-surface electrode portions 9 each having a relatively low adhesive strength separate from the bottom surface 5 of the component body 2 as illustrated in FIG. 3, the bottom-surface electrode portions 9 can be maintained in a state of being held by the end-surface electrode portions 10 each having a relatively high adhesive strength via the outer-layer plated films 19. Thus, for example, even when the bottom-surface electrode portions 9 completely separate from the bottom surface 5 of the component body 2, the bottom-surface electrode portions 9 will not fall off from the component body 2. In addition, as illustrated in FIG. 3, in the case where the coil component 1 is mounted on a mounting substrate 20, the probability that the component body 2 will be displaced with the end-surface electrode portions 10 on the mounting substrate 20 can be reduced, and the probability that the electrical connection state between the coil component 1 and the mounting substrate 20 will be less than ideal can be suppressed.

It is preferable that the thickness of each of the outer-layer plated films 19 be about 10 μm or more. When the thickness of each of the outer-layer plated films 19 is about 10 μm or more, each of the outer-layer plated films 19 can obtain a mechanical strength equal to or higher than a predetermined degree. As a result, the outer-layer plated films 19 can more reliably exhibit its function of causing the bottom-surface electrode portions 9 separated from the component body 2 to be held by the end-surface electrode portions 10 via the outer-layer plated films 19.

Figure 2C:
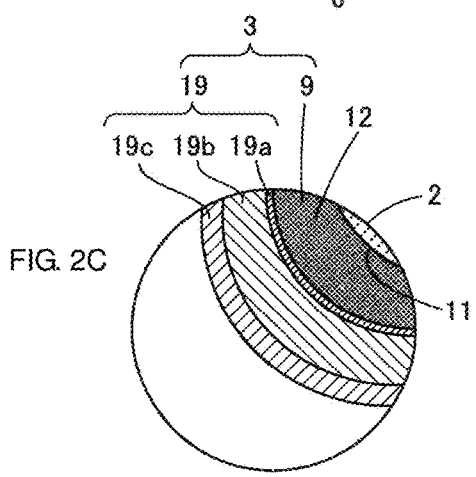
FIG. 2C is an enlarged sectional view of another portion of the coil component illustrated in FIG. 1.
Figure 2B:
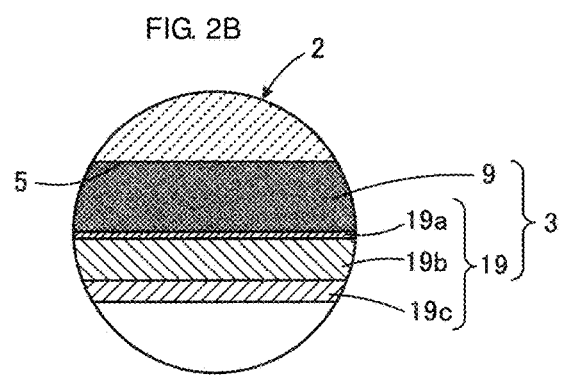
FIG. 2B is an enlarged sectional view of another portion of the coil component illustrated in FIG. 1.
Figure 3:
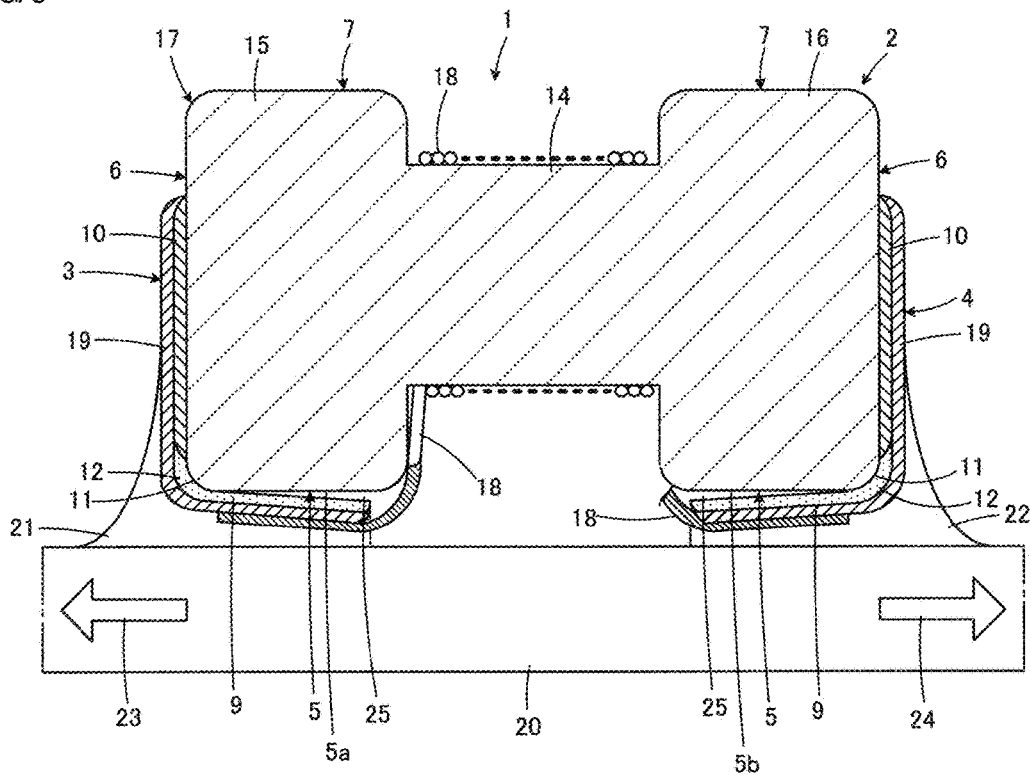
FIG. 3 is a sectional view illustrating the coil component illustrated in FIG. 1 in a state of being mounted on a mounting substrate.

As illustrated in FIGS. 2A to 2C, as each of the outer-layer plated films 19, a plurality of plated layers are preferably formed, the plurality of plated layers including a nickel plated layer 19a, a copper plated layer 19b formed on the nickel plated layer 19a, and a tin plated layer 19c formed on the copper plated layer 19b. In this case, as an example, the thickness of the nickel plated layer 19a is set to about 3 μm. The thickness of the copper plated layer 19b is set to about 30 μm or more and about 50 μm or less (i.e., from about 30 μm to about 50 μm). The thickness of the tin plated layer 19c is set to about 10 μm.

Note that, in each of the outer-layer plated films 19, there will be no problem as long as the tin plated layer 19c is the outermost layer, and thus, a lamination order of Cu/Ni/Sn may be employed instead of the above-mentioned lamination order of Ni/Cu/Sn. In addition, the copper plated layer 19b has a function of improving the adhesion of plating, and thus, for example, the copper plated layer 19b may be divided into two layers and formed so as to have a thickness larger than the above-mentioned thickness.

The situation in which the adhesive strength of each of the bottom-surface electrode portions 9 is lower than the adhesive strength of each of the end-surface electrode portions 10, which is the feature of the present disclosure, can be confirmed by, for example, conducting the following heat cycle test.

A sample is prepared by mounting a coil component that includes outer electrodes, each of which is formed in a recommended component shape by performing a method of forming bottom-surface electrode portions and a method of forming end-surface electrode portions, onto a substrate made of flame retardant type 4 (FR-4) with a solder paste portion having a recommended component thickness. Then, a combination of storing the sample at −40° C. for 30 minutes and storing the sample at +105° C. for 30 minutes is set as one cycle, and a heat cycle test in which this cycle is repeated several times is conducted. This heat cycle test is conducted until it is observed that at least one of the bottom-surface electrode portions and the end-surface electrode portions have separated from the coil component, and it can be evaluated that one of the bottom-surface electrode portions and the end-surface electrode portions that have separated from the coil component first each have a lower adhesive strength.

As described above, the adhesive strength of each of the bottom-surface electrode portions 9 with respect to the component body 2 may be about zero. In other words, the bottom-surface electrode portions 9 may be in a state of being separated from the bottom surface 5 of the component body 2. This state may occur after the coil component 1 has been mounted on the mounting substrate 20 as illustrated in FIG. 3.

That is to say, in a state where the outer electrodes 3 and 4 of the coil component 1 are connected to conductors of the mounting substrate 20 with solder portions 21 and 22, when stress is generated in the mounting substrate 20 in the directions of arrows 23 and 24 as a result of, for example, temperature changes or deflection occurred in the mounting substrate 20, at least a portion of one of the bottom-surface electrode portions 9 is brought into a state of being separated from the bottom surface 5 of the component body 2 before cracks are generated in the solder portions 21 and 22 or before a fracture occurs in the component body 2. As a result, cracks are prevented from being generated in the solder portions 21 and 22, and a fracture is prevented from occurring in the component body 2.

FIG. 3 illustrates gaps 25 each of which is generated between one of the bottom-surface electrode portions 9 and the bottom surface 5. It should be understood that the gaps 25 are exaggeratedly illustrated in order to clearly illustrate the state in which the bottom-surface electrode portions 9 have separated from the bottom surface 5. Thus, in practice, such a situation in which the gaps 25 clearly appear rarely occurs, and on the contrary, the bottom-surface electrode portions 9 are often in contact with the bottom surface 5 even after the bottom-surface electrode portions 9 have separated from the bottom surface 5.

The present disclosure is also directed to a mounting structure of the coil component 1 such as that described above. Note that, in the description of the mounting structure of the coil component 1 according to the present disclosure, it is stated that at least a portion of one of the bottom-surface electrode portions 9 separates from the bottom surface 5 of the component body 2 instead of simply stating that the bottom-surface electrode portions 9 separate from the bottom surface 5 of the component body 2 in order to include not only a case where both a portion of the bottom-surface electrode portion 9 of the first outer electrodes 3 and a portion of the bottom-surface electrode portion 9 of the second outer electrode 4 separate from the bottom surface 5 but also a case where a portion of only one of the bottom-surface electrode portions 9 of the first and second outer electrodes 3 and 4 separates from the bottom surface 5.

Figure 4:
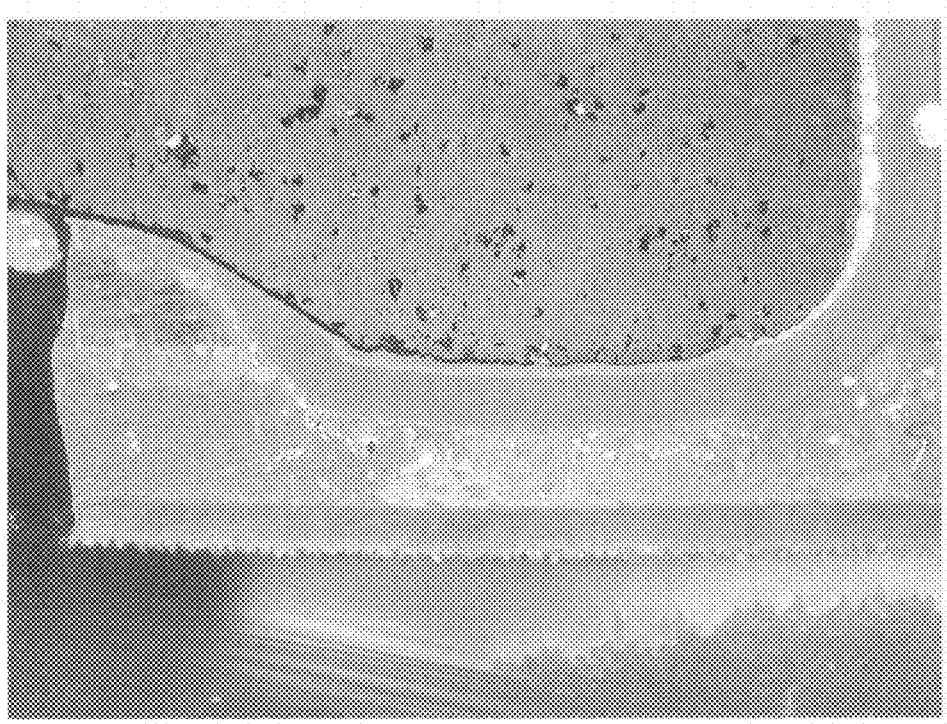
FIG. 4 is a photograph of a cross section obtained by grinding an outer electrode of a working product and a component body in order to confirm a state in which at least a portion of a bottom-surface electrode portion of the outer electrode is separated from the bottom surface of the component body in the working product.

FIG. 4 is a photograph of a cross section obtained by grinding an outer electrode and a component body of a working product in order to confirm a state in which at least a portion of a bottom-surface electrode portion of the outer electrode has separated from the bottom surface of the component body in the working product. FIG. 4 illustrates a portion in the vicinity of the flange-portion bottom surface 5b of the second flange portion 16 that is illustrated at the lower right of FIG. 3 and, as a principal portion of the outer electrode 4, the bottom-surface electrode portion 9 that is disposed so as to cover the bottom surface 5b.

In FIG. 4, the gap 25 formed between the bottom-surface electrode portion 9 and the bottom surface 5 appears as a somewhat thick black line, and the presence of the gap 25 can be confirmed.

Although the coil component according to the present disclosure has been described above on the basis of the embodiments related to the wire-wound coil component 1 including, as the component body 2, the core 17 that includes the winding core portion 14, the first flange portion 15, which is formed at the first end of the winding core portion 14, and the second flange portion 16, which is formed at the second end of the winding core portion 14 that is opposite to the first end of the winding core portion 14, and the wire 18 that is wound around the winding core portion 14, the embodiments are examples, and various other modifications can be made.

For example, the present disclosure can also be applied to a coil component that has a multilayer structure and whose component body is formed of a multilayer body including a plurality of insulator layers that are laminated together and a coil conductor that is disposed along the interface between the insulator layers in the multilayer body.

In addition, in the case of a wire-wound coil component, the number of wires included in the coil component, a wire winding direction, the number of outer electrodes, and so forth may be changed in accordance with a function of the coil component. In the case where a coil component includes a plurality of outer electrodes, the coil component may include an outer electrode that does not have the characteristic configuration according to the present disclosure as long as at least one of the outer electrodes included in the coil component has the characteristic configuration according to the present disclosure.

While some embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A coil component comprising:
   a component body that at least has a bottom surface facing a mounting surface and an end surface extending in a direction away from the mounting surface; and
   an outer electrode that is formed on an outer surface of the component body, the outer electrode including a bottom-surface electrode portion that is disposed along the bottom surface of the component body and an end-surface electrode portion that is disposed along the end surface of the component body so as to be continuous with the bottom-surface electrode portion, and the bottom-surface electrode portion has a different material composition than the end-surface electrode portion which causes the bottom-surface electrode portion to have an adhesive strength with respect to the component body that is lower than an adhesive strength of the end-surface electrode portion with respect to the component body.

2. The coil component according to claim 1, wherein the adhesive strength of the bottom-surface electrode portion with respect to the component body is about zero.

3. The coil component according to claim 1, wherein
   the component body includes a round chamfered portion that is formed at a ridge line portion between the bottom surface and the end surface, and the bottom-surface electrode portion further includes a round electrode portion that is disposed along the round chamfered portion and that extends to the end-surface electrode portion.

4. The coil component according to claim 1, wherein
the component body includes a core including a winding core portion, a first flange portion, which is formed at a first end of the winding core portion, and a second flange portion, which is formed at a second end of the winding core portion that is opposite to the first end of the winding core portion, and a wire that is wound around the winding core portion,
the bottom surface includes flange-portion bottom surfaces of the first and second flange portions that face the mounting surface, and the end surface include flange-portion end surfaces of the first and second flange portions that are located on a side opposite to a side on which the winding core portion is present, and
the outer electrode is electrically connected to an end of the wire and is formed so as to extend from the flange-portion bottom surface to the flange-portion end surface of one of the first and second flange portions.

5. The coil component according to claim 4, wherein
each of the first and second flange portions has a flange-portion top surface facing in a direction opposite to a direction in which the bottom surface faces, and
the end-surface electrode portion of the outer electrode is not formed on the flange-portion top surface and a portion of the flange-portion end surface adjacent to the flange-portion top surface.

6. The coil component according to claim 4, wherein the end-surface electrode portion is a sputtered film.

7. The coil component according to claim 4, wherein the end-surface electrode portion is a conductor containing a glass coupled to the core.

8. The coil component according to claim 1, wherein the outer electrode further includes an outer-layer plated film that coats the bottom-surface electrode portion and the end-surface electrode portion in a continuous manner.

9. The coil component according to claim 8, wherein the outer-layer plated film has a thickness of about 10 μm or more.

10. A coil-component-equipped mounting substrate comprising:
the coil component according to claim 1; and
a mounting substrate onto which the coil component is mounted and that includes a conductor to which the outer electrode are soldered,
wherein at least a portion of the bottom-surface electrode portion has separated from the bottom surface of the component body.

11. The coil component according to claim 2, wherein
the component body includes a round chamfered portion that is formed at a ridge line portion between the bottom surface and the end surface, and
the bottom-surface electrode portion further includes a round electrode portion that is disposed along the round chamfered portion and that extends to the end-surface electrode portion.

12. The coil component according to claim 2, wherein
the component body includes a core including a winding core portion, a first flange portion, which is formed at a first end of the winding core portion, and a second flange portion, which is formed at a second end of the winding core portion that is opposite to the first end of the winding core portion, and a wire that is wound around the winding core portion,
the bottom surface includes flange-portion bottom surfaces of the first and second flange portions that face the mounting surface, and the end surface include flange-portion end surfaces of the first and second flange portions that are located on a side opposite to a side on which the winding core portion is present, and
the outer electrode is electrically connected to an end of the wire and is formed so as to extend from the flange-portion bottom surface to the flange-portion end surface of one of the first and second flange portions.

13. The coil component according to claim 12, wherein
each of the first and second flange portions has a flange-portion top surface facing in a direction opposite to a direction in which the bottom surface faces, and
the end-surface electrode portion of the outer electrode is not formed on the flange-portion top surface and a portion of the flange-portion end surface adjacent to the flange-portion top surface.

14. The coil component according to claim 12, wherein
the flange-portion bottom surface has a low resistance portion having an electrical resistance lower than an electrical resistance of another portion of the core, and
the bottom-surface electrode portion is an electroplated film precipitated on the low resistance portion.

15. The coil component according to claim 12, wherein the bottom-surface electrode portion is made of a resin that contains metal powder and that does not contain glass.

16. The coil component according to claim 12, wherein the end-surface electrode portion is a sputtered film.

17. The coil component according to claim 12, wherein the end-surface electrode portion is a conductor containing a glass coupled to the core.

18. The coil component according to claim 2, wherein the outer electrode further includes an outer-layer plated film that coats the bottom-surface electrode portion and the end-surface electrode portion in a continuous manner.

19. A coil component comprising:
a component body that at least has a bottom surface facing a mounting surface and an end surface extending in a direction away from the mounting surface; and
an outer electrode that is formed on an outer surface of the component body, the outer electrode including a bottom-surface electrode portion that is disposed along the bottom surface of the component body and an end-surface electrode portion that is disposed along the end surface of the component body so as to be continuous with the bottom-surface electrode portion, and an adhesive strength of the bottom-surface electrode portion with respect to the component body is lower than an adhesive strength of the end-surface electrode portion with respect to the component body, wherein
the component body includes a core including a winding core portion, a first flange portion, which is formed at a first end of the winding core portion, and a second flange portion, which is formed at a second end of the winding core portion that is opposite to the first end of the winding core portion, and a wire that is wound around the winding core portion,
the bottom surface includes flange-portion bottom surfaces of the first and second flange portions that face the mounting surface, and the end surface include flange-portion end surfaces of the first and second flange portions that are located on a side opposite to a side on which the winding core portion is present,
the outer electrode is electrically connected to an end of the wire and is formed so as to extend from the flange-portion bottom surface to the flange-portion end surface of one of the first and second flange portions, the flange-portion bottom surface has a low resistance portion having an electrical resistance lower than an electrical resistance of another portion of the core, and the bottom-surface electrode portion is an electroplated film precipitated on the low resistance portion.

20. A coil component comprising:

a component body that at least has a bottom surface facing a mounting surface and an end surface extending in a direction away from the mounting surface; and an outer electrode that is formed on an outer surface of the component body, the outer electrode including a bottom-surface electrode portion that is disposed along the bottom surface of the component body and an end-surface electrode portion that is disposed along the end surface of the component body so as to be continuous with the bottom-surface electrode portion, and an adhesive strength of the bottom-surface electrode portion with respect to the component body is lower than an adhesive strength of the end-surface electrode portion with respect to the component body, wherein the component body includes a core including a winding core portion, a first flange portion, which is formed at a first end of the winding core portion, and a second flange portion, which is formed at a second end of the winding core portion that is opposite to the first end of the winding core portion, and a wire that is wound around the winding core portion, the bottom surface includes flange-portion bottom surfaces of the first and second flange portions that face the mounting surface, and the end surface include flange-portion end surfaces of the first and second flange portions that are located on a side opposite to a side on which the winding core portion is present, the outer electrode is electrically connected to an end of the wire and is formed so as to extend from the flange-portion bottom surface to the flange-portion end surface of one of the first and second flange portions, and the bottom-surface electrode portion is made of a resin that contains metal powder and that does not contain glass.

* * * * *